United States Patent [19]

Chatterjee

[11] Patent Number: 4,683,486
[45] Date of Patent: Jul. 28, 1987

[54] DRAM CELL AND ARRAY

[75] Inventor: Pallab K. Chatterjee, Richardson, Tex.

[73] Assignee: Texas Instruments Incorporated, Dallas, Tex.

[21] Appl. No.: 654,285

[22] Filed: Sep. 24, 1984

[51] Int. Cl.$^4$ .................. H01L 29/78; H01L 29/04; H01L 29/06; H01L 27/02
[52] U.S. Cl. .................................. 357/23.6; 357/59; 357/55; 357/41
[58] Field of Search ................... 357/23.6, 59, 55

[56]   References Cited
U.S. PATENT DOCUMENTS

| 4,199,772 | 4/1980 | Natori et al. | 357/23.6 |
| 4,353,086 | 10/1982 | Jaccodine et al. | 357/49 |
| 4,396,930 | 8/1983 | Mizutani | 357/23 |
| 4,462,040 | 7/1984 | Ho et al. | 357/23.6 |

FOREIGN PATENT DOCUMENTS

| 48405 | 5/1984 | European Pat. Off. | 357/23.6 |
| 59-19366 | 1/1984 | Japan | 357/23.6 |

OTHER PUBLICATIONS

Chang et al., IBM Technical Disc. Bulletin, No. 8B, vol. 22, pp. 3683-3687.

Primary Examiner—Martin H. Edlow
Assistant Examiner—Robert P. Limanek
Attorney, Agent, or Firm—Douglas A. Sorensen; Leo N. Heiting; Melvin Sharp

[57]   ABSTRACT

A dRAM cell and array of cells, together with a method of fabrication, are disclosed wherein the cell includes one field effect transistor and one storage capacitor with both the transistor and the capacitor formed in a trench in a substrate. The transistor source, channel, and drain and one capacitor plate are formed in a layer of material inserted into the trench and insulated from the substrate; the gate and other capacitor plate are formed in the substrate trench sidewall. In preferred embodiments bit lines on the substrate surface connect to the inserted layer, and word lines on the substrate surface are formed as diffusions in the substrate which also form the gate. The trenches and cells are formed in the crossings of bit lines and word lines; the bit lines and the word lines form perpendicular sets of parallel lines.

11 Claims, 7 Drawing Figures

DRAM CELL AND ARRAY

BACKGROUND

The present invention relates to semiconductor devices, and, more particularly, to dynamic random access memories.

The development of large monolithic dynamic random access memories (dRAMs) has run into many problems, and one of the most important of these problems is that of shrinking the dRAM cell size without increasing the soft-error rate in order to pack more cells on a chip. Large dRAMs are silicon based and each cell typically includes a single MOS field effect transistor with its source connected to a storage capacitor, its drain connected to a bit line, and its gate connected to a word line; the cell operates by storing a charge on the capacitor for a logic 1 and not storing any charge for a logic 0. Traditionally the cell capacitor has been formed by an inversion layer separated from an overlying electrode by a thin oxide layer and from the substrate by a depletion layer. However, to maintain stable circuit operation the capacitance must be large enough to yield a sufficient signal to noise ratio, and this leads to large substrate area devoted to the capacitor. Further, such a MOS capacitor is vulnerable to charges generated in the substrate by alpha particles (a 5 MeV alpha particle can produce more than 200 femtocoulombs of hazardous electrons), noise injected from the substrate, pn junction leakage over the entire area of the capacitor, and subthreshold leakage of the cell transistor. A typical stored charge in a dRAM cell is 250 fC. For a three volt power supply this requires a storage capacitor of 50 fF; and with a storage oxide thickness of 150 A, a capacitor area of about 20 square microns is needed. This imposes a lower limit on the cell size if conventional two dimensional technology is used.

One approach to solve these problems appears in Jolly et al, A Dynamic RAM Cell in Recrystallized Polysilicon, 4 IEEE Elec. Dev.Lett. 8 (1983) and forms all basic elements of the cell, including both the access transistor and the charge storage capacitor, in a layer of beam recrystallized polysilicon deposited on an oxide layer on a silicon substrate. The bit line is contained in the recrystallized polysilicon layer, and turning on the transistor causes charge to flow into the storage region, which is composed of heavily doped, recrystallized polysilicon surrounded on the top, bottom, and three sides by thermally grown oxide. The storage capability is about twice that of a conventional capacitor of the same storage area since electrodes both above and below are separated from the storage region in the recrystallized polysilicon by thin oxides. In addition, the lower oxide isolates the storage region from any charge injected into the substrate either from surrounding circuitry or by alpha particles or other radiation generating soft errors. Further, thick oxide under the bit line and complete sidewall oxide isolation reduce the bit-line capacitance. However, even doubling the capacitance over the traditional design fails to sufficiently shrink the area occupied by the cell capacitor.

A second approach to shrinking dRAM cell size relies on a capacitor with plates extending into the substrate. This capacitor, called a corrugated capacitor, is described in H. Sunami et al, A Corrugated Capacitor Cell (CCC) for Megabit Dynamic MOS Memories, IEEE IEDM Tech Digest 806 (1982); H Sunami et al, A Corrugated Capacitor Cell (CCC) for Megabit Dynamic MOS Memories, 4 IEEE Elec. Dev. Lett. 90 (1983); and K. Itoh et al, An Experimental 1Mb DRAM with On-Chip Voltage Limiter, 1984 IEEE ISSCC Digest of Tech Papers 282. The corrugated capacitor extends about 2.5 microns into the silicon substrate. Fabrication proceeds as follows: Trenches are formed by ordinary reactive sputter etching with CCl gas using a CVD silicon dioxide film mask; a wet etch cleans up any dry etching damage and contaminations. After trench formation, a triple storage layer of silicon dioxide/silicon nitride/silicon dioxide is formed on the trench walls. Lastly, the trench is filled with LPCVD polysilicon. Use of the corrugated capacitor assertedly yields more than seven times the capacitance of the conventional cell, with a three micron by seven micron cell having a 60 fF storage capacitance.

A third approach to shrink the area occupied by the cell capacitor is similar to the approach described in the preceding paragraph and forms the capacitor in a trench. For example, E. Arai, Submircon MOS VLSI Process Technologies, IEEE IEDM Tech Digest 19 (1983); K. Minegishi et al, A Submicron CMOS Megabit Dynamic RAM Technology Using Doped Face Trench Capacitor Cell, IEEE IEDM Tech Digest 319 (1983); and T. Morie et al, Depletion Trench Capacitor Technology for Megabit Level MOS dRAM, 4 IEEE Elec. Dev. Lett. 411 (1983) all describe a cell with a traditional design except for the capacitor which has been changed from plates parallel to the substrate to plates on the walls of a trench in the substrate. Such a trench capacitor permits large capacitance per area of substrate by simply using a deep trench. The capacitors described in these articles were fabricated as follows: Starting with (100) oriented, p-type, 4-5 ohm-cm resistivity silicon substrates, trench patterns with 0.4-1.0 micron width were formed by electron-beam direct writing. Trenches of 1-3 micron depth were then excavated by reactive ion etching with $CBrF_3$ at a pressure of about 14 mTorr; the trench surfaces were cleared of RIE damage by an etch in a mixture of nitric, acetic, and hydrofluoric acids. PSG was then deposited by CVD using a $PH_3/SiH_4/O_2$ gas system, the phosphorous diffused into the trench surface layers, and the PSG etched away by hydrofluoric acid. $SiO_2$ of 150-500 A was grown in dry $O_2$ or CVD $Si_3N_4$ was deposited 500 A thick on the trench walls. Lastly, the trenches were filled with LPCVD polysilicon. the capacitance per unit area of trench sidewall was comparable to the capacitance per unit area of a traditional capacitor; consequently, deep trench capacitors can shrink cell substrate area by enhancing the storage capacitor area per unit substrate area.

The use of trenches for isolation is also well known and has been extensively studied; for example, R. Rung et al, Deep Trench Isolated CMOS Devices, IEEE IEDM Tech Digest 237 (1982); K. Cham et al, A Study of the Trench Inversion Problem in the Trench CMOS Technology, 4 IEEE Elec. Dev. Lett. 303 (1983); A Hayasaka et al, U-Groove Isolation Technique for High Speed Bipolar VLSI's, IEEE IEDM Tech Digest 62 (1982); H. Goto et al, An Isolation Technology for High Performance Bipolar Memories —IOP-II, IEEE IEDM Tech Digest 58 (1982); T. Yamaguchi et al, High-Speed Latchup-Free 0.5-um-Channel CMOS Using Self-Aligned $TiSi_2$ and Deep-Trench Isolation Technologies, IEEE IEDM Tech Digest 522 (1983); S. Kohyama et al, Directions in CMOS Technology, IEEE IEDM Tech Digest 151 (1983); and K. Cham et al, Characterization and Modeling of the Trench Surface Inversion Problem for the Trench Isolated CMOS Technology, IEEE IEDM Tech Digest 23 (1983). These isolation trenches are formed in a manner similar to that described for the trench and corrugated cpacitors; namely, patterning (typically with oxide mask), RIE with $CBrF_3$, $CCl_4$, $Cl_2-H_2$, $CCl_4-O_2$, etc. excavation, thermal oxidation (plus LPCVD nitride) of the sidewalls, and filling with polysilicon.

However, the use of trench capacitors fails to fully solve the problems of shrinking dRAM cell size; namely, the cell still occupies a large substrate area for both the horizontally placed field effect transistor and a vertically placed trench capacitor.

SUMMARY OF THE INVENTION

The present invention provides a one-transistor dRAM cell structure in which the cell transistor is formed on the sidewalls of a substrate trench containing the cell capacitor; this yields a stacking of the transistor on top of the capacitor and a minimal cell area on the substrate to solve the problem of dense packing of cells. In preferred embodiments one capacitor plate and the transistor channel are formed in a single layer of polysilicon deposited in the trench, and the gate oxide and capacitor insulator oxide are simultaneously formed.

DESCRIPTION OF THE PREFERRED EMBODIMENTS

Figure 1A:
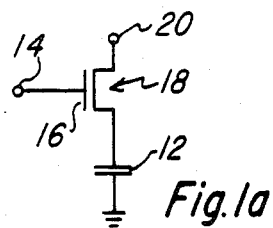
FIGS. 1A-B are the schematic equivalent circuit and local memory array geometry for both preferred embodiment dRAM cells.

The preferred embodiment dRAM cells are one transistor/one capacitor cells connected to bit and word lines as shown in schematic FIG. 1A and operate as follows. Capacitor 12 stores charge to represent a bit of information (for example, no stored charge could represent a logic 0 and the stored charge corresponding to a potential of 5 volts across the capacitor plates could represent a logic 1). The bit of information is accessed (to read or to write a new bit) by applying a voltage on word line 14 connected to gate 16 to turn on transistor 18; a turned on transistor 18 connects capacitor 12 to bit line 20 for the read or write. Leakage currents and other sources of decay of the charge on capacitor 12 necessitate periodic refreshing of the charge, and thus the name dynamic RAM (dRAM).

Figure 1B:
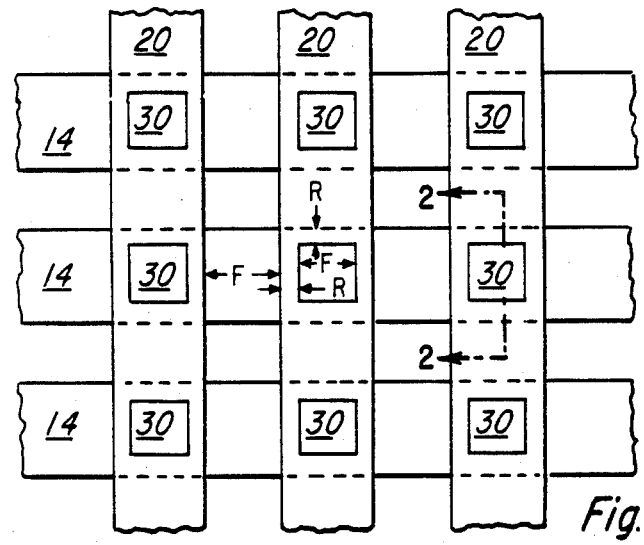

FIG. 1B is a plan view showing a portion of a dRAM array of bit lines 20 and word lines 14 with preferred embodiment cells 30 at the intersections of the lines; note that bit lines 20 pass over word lines 14. The cells extend down into the substrate below the lines and provide a maximal density memory. If the minimum feature size is denoted by f and the minimum registration is denoted by R, then the cell area is $[2(f+R)]^2$. For example, with a minimum feature size of 1.0 micron and a minimum registration of 0.25 micron, the cell area is about 6.25 square microns.

Figure 2:
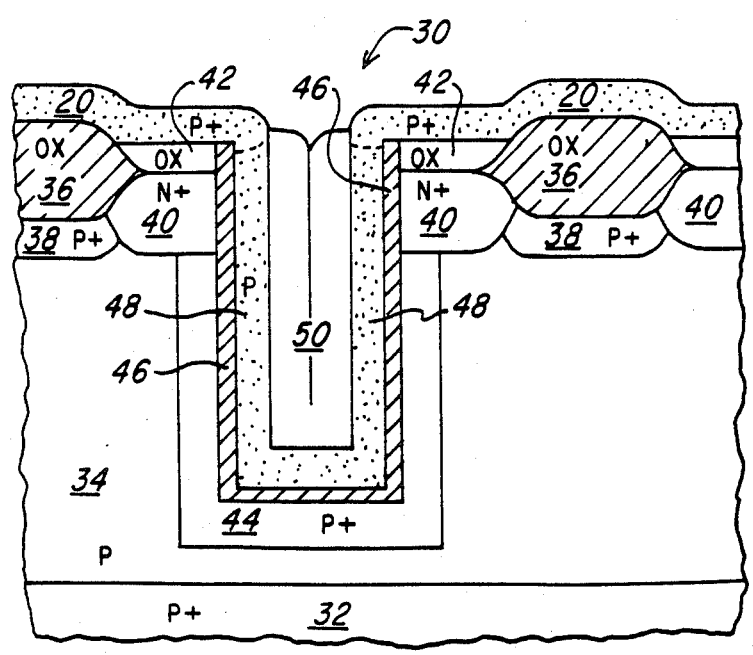
FIG. 2 is a schematic cross sectional elevation of a first preferred embodiment dRAM cell.

FIG. 2 is a cross sectional view of first preferred embodiment dRAM cell, generally denoted 30. Cell 30 is formed in p+ silicon substrate 32 with p epilayer 34 and includes field oxide 36, p+ channel stops 38, buried n+ gate region 40, word line oxide 42, p+ capacitor plate region 44, capacitor insulator/gate oxide 46, p polysilicon capacitor plate/channel region 48, p+ or silicided polysilicon bit line 20, and oxide 50. The view in FIG. 2 corresponds to a cross section along vertical line 2—2 in FIG. 1B; region 40 extends in a direction perpendicular to the paper in FIG. 2 to form word line 14; and the square cross section of the trench in substrate 32/epilayer 34/buried region 40 containing capacitor 12 and transistor 18 is apparent in FIG. 1B.

In cell 30 capacitor 12 is formed with the plates being region 44 and that portion of region 48 opposite region 44; the insulator is that portion of layer 46 between the two plates. Note that the charge is stored on region 48 and thus is isolated from the substrate by the oxide layer 46. For a trench with a 1 micron by 1 micron cross section and 6 microns deep, the capacitor plate area would be about 21 square microns if gate region 40 takes up about 1 micron of the depth.

In cell 30 transistor 18 is a p-channel depletion mode field effect transistor with its source in the capacitor plate portion of layer 48, its channel the remainder of layer 48, its drain the portion of bit line 20 adjacent the channel, and its gate in region 40 which is integral with word line 14. Because the transistor operates in the depletion mode, the gate voltage is normally high, and this reverse biases the junction between gate region 40 and capacitor plate region 44.

Figure 3A:
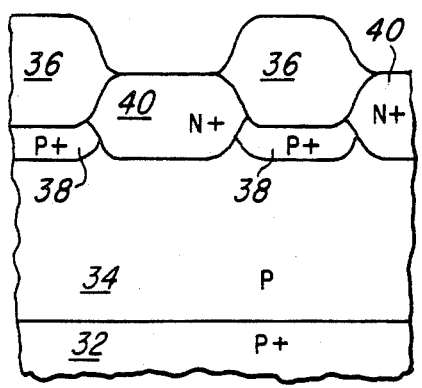
FIGS. 3A-3C illustrate a sequence of process steps for fabrication of the first preferred embodiment cell by a first preferred embodiment method.
Figure 3B:
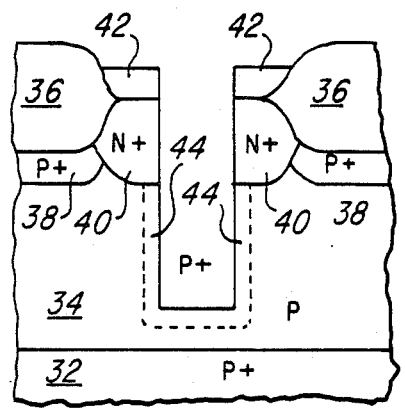
Figure 3C:
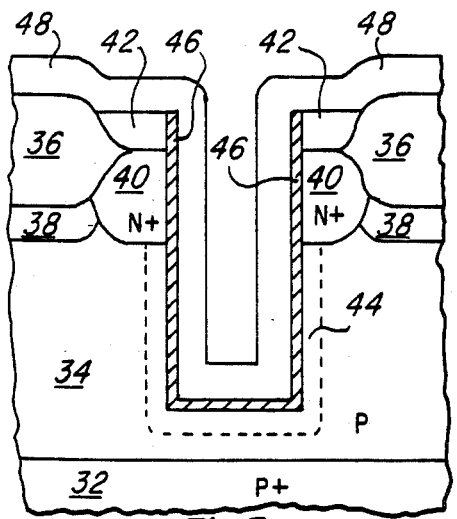

The dimensions and material characteristics of cell 30 are best understood in connection with the following description of a first preferred embodiment fabrication process which is illustrated in sequential cross sectional views in FIGS. 3A–C.

1. (100) oriented p+ silicon substrate 32 with p epilayer 34 of resistivity 5–10 ohm-cm has field oxide 36 with channel stops 38 formed in the usual manner: a stress relief oxide layer is grown on epilayer 34 and LPCVD nitride is deposited on the oxide; the active area is patterned and plasma etching removes the nitride and oxide outside the active area; a boron implant using the nitride as a mask creates channel stops 38; and field oxide 36 is grown to a thickness of 1.0 micron. The nitride is patterned for word lines 14/region 40, the stress relief oxide etched, and arsenic implanted to form word lines 14 and regions 40 to be n+ with a carrier density of 1E18 per cubic centimeter. Region 40 is about 2.0 microns wide and 0.7 microns thick; regions 40 are on a 2.5 micron pitch; see FIG. 3A.

2. 2,000 Å of oxide are grown on region 40; this oxide is patterned for 1.0 micron square trenches and plasma etched. The trenches are then excavated by reactive ion etching (RIE) with $HCl_4$ to a total depth of 3.5 microns using the oxide as a mask. After the trenches have been excavated, they are cleaned of RIE damage and contamination by a wet acid etch. Next, p+ layer 44 is formed by vapor phase diffusion of boron to a depth of about 1,000 Å and with a carrier density of 1E17 per $cm^3$. See FIG. 3B.

3. 150 Å of oxide 46 is thermally grown on the sidewalls of the trenches, regions 40 and 44, and forms the gate oxide for transistor 18 and the insulator for capacitor 12. 1,000 Å of polysilicon 48 doped p to a carrier density of 1E16 per cm is deposited by LPCVD and patterned to define bit lines 20. See FIG. 3C. That portion of polysilicon 48 opposite region 40 forms the channel of transistor 18, and that portion of polysilicon opposite region 44 forms a plate of capacitor 12.

4. The trench is filled with oxide 50, such as by a side wall process, and the horizontal portion of polysilicon 48 is silicided or doped p+ to form bit lilnes 20; completed cell 30 is shown in FIG. 2.

Cell 30 has the following characteristics: transistor 18 is a polysilicon transistor with channel width 4.0 microns, length 0.7 micron and thickness 1,000 A, which typically yields a leakage current of 0.5 pA. Capacitor 12 has a plate area of about 12 square microns and an oxide insulator thickness of 150 A which yields a capacitance of about 22 fF. If cell 30 were to be refreshed when the stored voltage deteriorates 2 volts, then the 22 fF and 0.5 pA indicates a maximum refresh interval of 90 msec. Cell 30 occupies about 6.25 square microns of substrate area, so a 100,000 square mils substrate could probably contain a 4 megabit memory using such cells.

Figure 4:
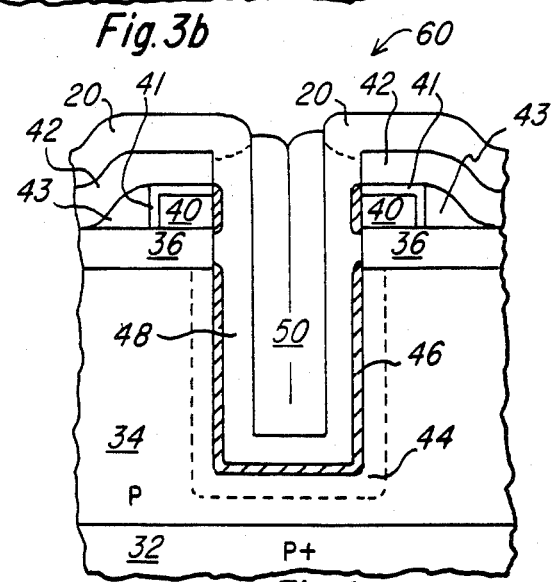
FIG. 4 is a schematic cross sectional elevation of a second preferred embodiment dRAM cell.

Second preferred embodiment cell 60 is shown in cross sectional elevation in FIG. 4 and differs from cell 30 by isolating transistor 18 from capacitor 12 with the oxide layer 36; note that analogous features in cells 30 and 60 are given the same reference numbers. In cell 60, word line 14/gate region 40 is formed by patterning a doped polysilicon layer which has been deposited on oxide layer 36; and after patterning, word line 14/gate region 40 is silicided, forming layer 41 of silicide and thereby lowering the resistance of the word lines. As with cell 30, an insulating oxide 42 is deposited over the word lines and patterned to form the mask for excavation of the trenches; however, for cell 60 the step created by region 40 must be covered by a sloped oxide 43 to avoid formation of spurious devices on the edge of the word lines away from the trenches. The oxides 42 and 43 may be deposited together using plasma enhanced CVD with planarizing sputtering. Otherwise, the fabrication of cell 60 parallels that of cell 30 as the does the performance; note that the channel length of transistor 18 is more easily controlled in cell 30 than in cell 60 because it is determined by the thickness of a diffused layer rather than that of a polysilicon layer.

Modifications of the preferred embodiment cells such as varying the dimensions, the shape of the trenches, doping levels, substitutional materials, and so forth are immediate. Similarly, modifications of the preferred embodiment methods of fabrication such as diffusion versus implantation, wet versus dry etching, various halocarbons for RIE, and so forth are also immediate.

I claim:

1. A device comprising:
a substrate having a trench;
an insulating layer formed on the walls of said trench;
a semiconductive layer formed on said insulating layer, said semiconductive layer having a transistor formed in said trench, said transistor having a source, a drain and a channel, said drain serving as a node for storing charge; and
a gate formed in said substrate adjacent to said insulating layer, said gate controlling current in said channel.

2. A device as in claim 1 wherein said semiconductive layer comprises polycrystalline silicon.

3. A device as in claim 1 wherein said gate comprises a doped region of opposite conductivity type as said substrate.

4. A device comprising:
a crystalline semiconductor substrate having a trench;
a silicon dioxide layer formed on the walls of said trench
a polycrystalline silicon layer formed on said insulating layer, said semiconductive layer having a transistor formed in said trench, said transistor having a source, a drain and a channel, said drain serving as a node for storing charge; and
a gate formed in said substrate adjacent to said insulating layer, said gate controlling current in said channel.

5. A device as in claim 4 wherein said gate comprises a doped region of opposite conductivity type as said substrate.

6. A memory array comprising:
a first plurality of parallel conductors formed on the surface of a substrate;
a second plurality of parallel conductors formed on the surface of said substrate perpendicular to said first plurality of conductors but insulated therefrom;
a plurality of memory cells formed substantially beneath the intersections of said first and second conductors, each of said memory cells including:
a substrate having a trench;
an insulating layer formed on the walls of said trench;
a semiconductive layer formed on said insulating layer, said semiconductive layer having a transistor formed in said trench, said transistor having a source, a drain and a channel, said drain serving as a node for storing charge; and
a gate formed in said substrate adjacent to said insulating layer, said gate controlling current in said channel.

7. A memory array as in claim 6 wherein said semiconductive layer comprises polycrystalline silicon.

8. A memory array as in claim 6 wherein said gate comprises a doped region of opposite conductivity type as said substrate.

9. A memory array comprising:
a first plurality of parallel conductors formed on the surface of a crystalline semiconductor substrate;
a second plurality of parallel conductors formed on the surface of said substrate perpendicular to said first plurality of conductors but insulated therefrom;
a plurality of memory cells formed substantially beneath the intersections of said first and second conductors, each of said memory cells including:
a trench formed in said substrate;
a silicon dioxide layer formed on the walls of said trench;
a polycrystalline silicon layer formed on said insulating layer, said semiconductive layer having a transistor formed in said trench, said transistor having a source, a drain and a channel, said drain serving as a node for storing charge;
a gate formed in said substrate adjacent to said insulating layer, said gate controlling current in said channel.

10. A memory array as in claim 9 wherein said semiconductive layer comprises polycrystalline silicon.

11. A memory as in claim 9 wherein said gate comprises a doped region of opposite conductivity type as said substrate.

* * * * *